United States Patent
Chou et al.

(10) Patent No.: US 7,602,261 B2
(45) Date of Patent: Oct. 13, 2009

(54) MICRO-ELECTROMECHANICAL SYSTEM (MEMS) SWITCH

(75) Inventors: Tsung-Kuan Allen Chou, San Jose, CA (US); Quan Tran, Fremont, CA (US)

(73) Assignee: Intel Corporation, Santa Clara, CA (US)

(*) Notice: Subject to any disclaimer, the term of this patent is extended or adjusted under 35 U.S.C. 154(b) by 414 days.

(21) Appl. No.: 11/317,960

(22) Filed: Dec. 22, 2005

(65) Prior Publication Data
US 2007/0146095 A1 Jun. 28, 2007

(51) Int. Cl.
*H01P 1/10* (2006.01)
(52) U.S. Cl. .................. 333/105; 333/262; 200/181
(58) Field of Classification Search ............... 333/101, 333/262, 258, 105; 200/181; 257/415; 438/52
See application file for complete search history.

(56) References Cited

U.S. PATENT DOCUMENTS

| | | | |
|---|---|---|---|
| 5,258,591 A | 11/1993 | Buck | |
| 6,495,387 B2* | 12/2002 | French | 438/52 |
| 6,686,820 B1 | 2/2004 | Ma et al. | |
| 6,812,810 B2 | 11/2004 | Ma et al. | |
| 6,812,814 B2 | 11/2004 | Ma et al. | |
| 6,875,936 B1 | 4/2005 | Suzuki et al. | |
| 6,876,482 B2 | 4/2005 | DeReus | |
| 6,880,235 B2 | 4/2005 | Ma | |
| 7,170,155 B2* | 1/2007 | Heck et al. | 257/684 |
| 7,321,275 B2* | 1/2008 | Chou et al. | 333/105 |
| 2002/0190267 A1 | 12/2002 | Robertson | |
| 2003/0020173 A1 | 1/2003 | Huff et al. | |
| 2003/0058069 A1 | 3/2003 | Schwartz et al. | |
| 2003/0201852 A1* | 10/2003 | Eliacin et al. | 333/262 |
| 2004/0000696 A1 | 1/2004 | Ma et al. | |
| 2004/0183148 A1 | 9/2004 | Blasko, III | |
| 2005/0007219 A1 | 1/2005 | Ma et al. | |
| 2005/0134413 A1 | 6/2005 | Bar et al. | |

(Continued)

FOREIGN PATENT DOCUMENTS

GB 2 353 410 A 2/2001

(Continued)

OTHER PUBLICATIONS

Shen, Shyh-Chiang et al., "Low Actuation Voltage RF MEMS Switches With Signal Frequencies From 0.25GHz to 40GHz," IEDM Technical Digest, 1999, pp. 689-692.

(Continued)

*Primary Examiner*—Benny Lee
*Assistant Examiner*—Gerald Stevens
(74) *Attorney, Agent, or Firm*—Blakely, Sokoloff, Taylor & Zafman LLP (57) ABSTRACT

An electromechanical switch includes an actuation electrode, a cantilever electrode, a contact, a suspended conductor, and a signal line. The actuation electrode is mounted to a substrate, the cantilever electrode is suspended proximate to the actuation electrode, and the contact is mounted to the cantilever electrode. The suspended conductor is coupled to the contact and straddles a portion of the cantilever electrode. The signal line is positioned to form a closed circuit with the contact and the suspended conductor when an actuation voltage is applied between the actuation electrode and the cantilever electrode.

21 Claims, 7 Drawing Sheets

U.S. PATENT DOCUMENTS

| | | |
|---|---|---|
| 2005/0219016 A1 | 10/2005 | Chou et al. |
| 2005/0248424 A1 | 11/2005 | Chou et al. |
| 2005/0285697 A1 | 12/2005 | Chou |
| 2006/0065942 A1 | 3/2006 | Chou et al. |
| 2006/0226501 A1 | 10/2006 | Allen Chou |

FOREIGN PATENT DOCUMENTS

| | | |
|---|---|---|
| WO | WO 97/18574 | 5/1997 |
| WO | WO 99/17322 | 4/1999 |
| WO | WO 2005/023699 A1 | 3/2005 |
| WO | WO 2005/104157 A1 | 11/2005 |
| WO | PCT/US2006/024724 | 11/2006 |

OTHER PUBLICATIONS

Pacheco, Sergio P. et al., "Design of Low Actuation Voltage RF MEMS Switch," IEEE MTT-S Digest, 2000, pp. 165-168.

U.S. Appl. No. 10/879,539, filed Jun. 29, 2004.

U.S. Appl. No. 10/955,153, filed Sep. 30, 2004.

Nishijima, N. et al., "A Low-Voltage High Contact Force RF-MEMS Switch," *IEEE MTT-S Digest* (2004), pp. 577-580.

International Search Report for PCT/US2006/046894 (filed Dec. 7, 2006), mailed May 14, 2007 (3 pages).

Written Opinion of the International Search Authority for PCT/US2006/046894 (filed Dec. 7, 2006), mailed May 14, 2007 (5 pages).

Park, Jae et al., "Electroplated RF MEMS Capacitive Switches," The Thirteenth Annual International Conference on MEMS 2000, Jan. 23-27, 2000, pp. 639-644.

U.S. Appl. No. 11/165,795, filed Jun. 23, 2005.

U.S. Appl. No. 11/168,195, filed Jul. 1, 2005.

PCT/US2006/046894, International Preliminary Report on Patentability and Written Opinion of the International Searching Authority, mailed Jul. 3, 2008, 6 pages.

* cited by examiner

MICRO-ELECTROMECHANICAL SYSTEM (MEMS) SWITCH

TECHNICAL FIELD

This disclosure relates generally to micro-electromechanical systems ("MEMS"), and in particular, relates to MEMS switches.

BACKGROUND INFORMATION

Micro-electromechanical systems ("MEMS") devices have a wide variety of applications and are prevalent in commercial products. One type of MEMS device is a MEMS radio frequency (RF) switch. A typical MEMS RF switch includes one or more MEMS switches arranged in an RF switch array. MEMS RF switches are ideal for wireless devices because of their low power characteristics and ability to operate in radio frequency ranges. MEMS RF switches are well suited for applications including cellular telephones, wireless networks, communication systems, and radar systems. In wireless devices, MEMS RF switches can be used as antenna switches, mode switches, transmit/receive switches, and the like.

Known MEMS switches use an electroplated metal cantilever supported at one end and having an electrical RF contact near the distal end of the metal cantilever. An actuation electrode is positioned below the electrical RF contact and a direct current ("DC") actuation voltage applied to either the actuation electrode or the metal cantilever forcing the metal cantilever to bend downward and make electrical contact with a bottom RF signal trace. Once electrical contact is established, the circuit is closed and an RF signal superimposed over the DC actuation voltage can pass through the metal cantilever to the actuation electrode and/or to the bottom RF signal trace.

These MEMS switches typically require 40 V or more actuation voltage. If the actuation voltage is reduce much below 40 V, then the spring constant of the cantilever must be reduced. These lower voltage MEMS switches suffer from "stiction" (i.e., stuck in a closed circuit position) and tend to be self-actuated by RF signals or vibrations due to their ultra low spring constants. During fabrication, the electroplated metal cantilever suffers from high stress gradients and therefore has a tendency to curl upwards at the distal end, referred to as switch stress gradient bending. Accordingly, the actuation voltage must be sufficiently large to overcome the larger separation distance due to beam bending and induce electrostatically collapsing contact between the metal cantilever and the actuation electrode below. Furthermore, during high speed switching operation, known MEMS switches suffer from frequency limiting, air damping resistance.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a micro-electromechanical system ("MEMS") switch and systems thereof are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
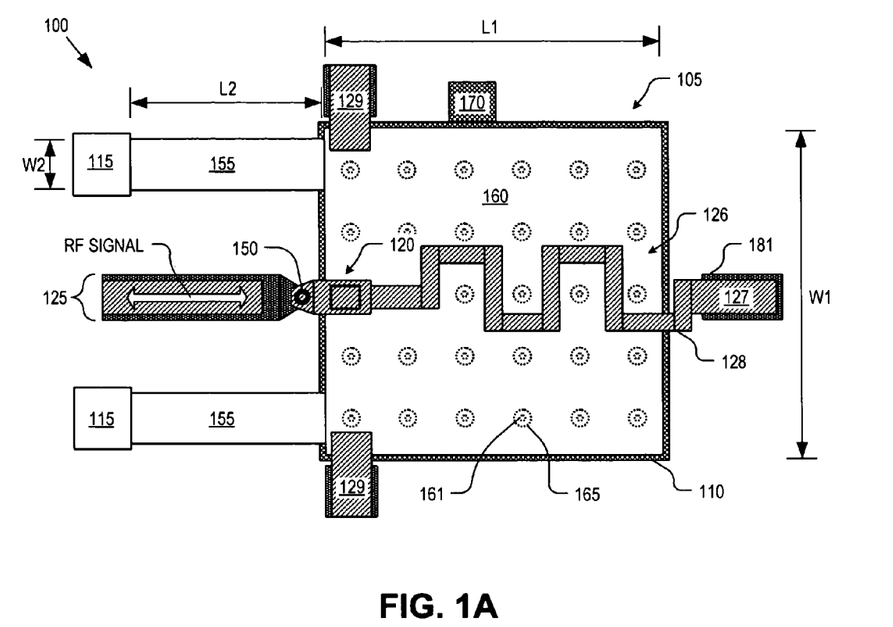
FIG. 1A is a schematic diagram illustrating a plan view of a micro-electromechanical system ("MEMS") switch, in accordance with an embodiment of the invention.
Figure 1B:
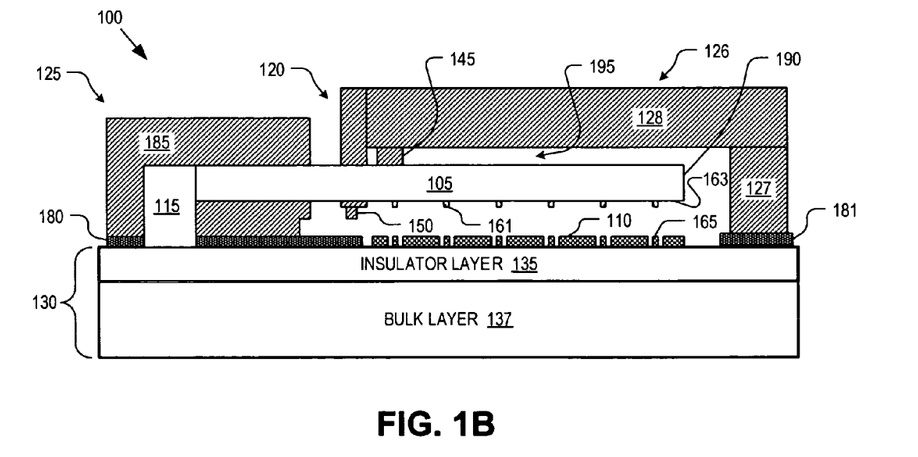
FIG. 1B is a schematic diagram illustrating a cross-sectional view of a MEMS switch, in accordance with an embodiment of the invention.

FIGS. 1A and 1B are schematic diagrams illustrating a MEMS switch 100, in accordance with an embodiment of the invention. FIG. 1A is a plan view of MEMS switch 100 while FIG. 1B is a cross-sectional view of the same. It should be appreciated that the figures herein are not drawn to scale, but rather are merely intended for illustration.

The illustrated embodiment of MEMS switch 100 includes a cantilever electrode 105, an actuation electrode 110, anchors 115, a contact 120, a signal line 125, a conductive tether 126 (also referred to as a suspended conductor 126), and top stoppers 129 (excluded from FIG. 1B for clarity). MEMS switch 100 is mounted on a substrate 130, which includes an insulating layer 135 and a bulk layer 137. The illustrated embodiment of contact 120 includes a contact mount 145 and a protruding contact 150. The illustrated embodiment of cantilever electrode 105 includes narrow members 155 and a plate member 160. Plate member 160 further includes stopper stubs 161 formed on an underside 163. Stopper butts 165 are defined within actuation electrode 110, but electrically insulated therefrom and positioned to abut stopper stubs 161 when cantilever electrode 105 collapses onto actuation electrode 110. Actuation electrode 110 includes an input port 170 for applying an actuation voltage between actuation electrode 110 and cantilever electrode 105 to induce a progressive electrostatic collapse of cantilever electrode 105. Signal line 125 includes a bottom electrode 180 and an upper layer 185. It should be appreciated that in some cases only one or two instances of a component/element have been labeled so as not to crowd the drawings.

Figure 2A:
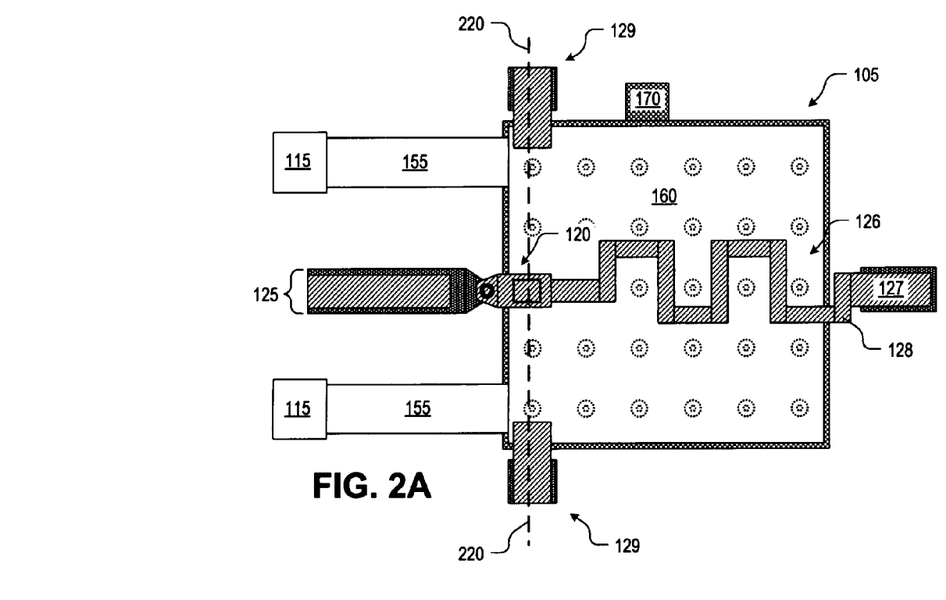
FIG. 2A is a schematic diagram illustrating a plan view of a micro-electromechanical system ("MEMS") switch, in accordance with an embodiment of the invention.
Figure 2B:
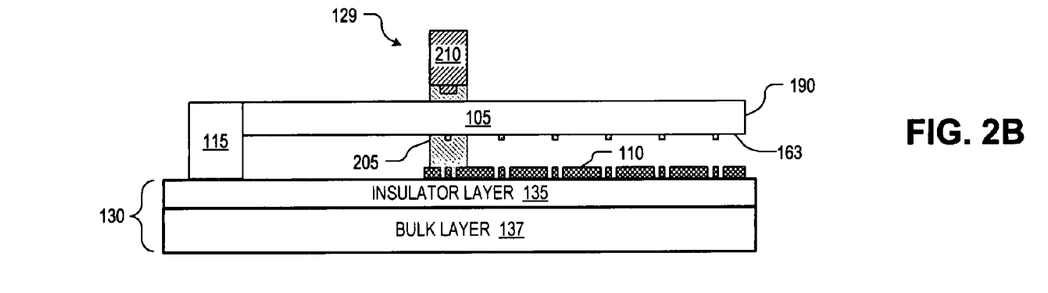
FIG. 2B is a schematic diagram illustrating a cross-sectional view of a MEMS switch illustrating a top stopper and excluding a conductive tether, in accordance with an embodiment of the invention.
Figure 2C:
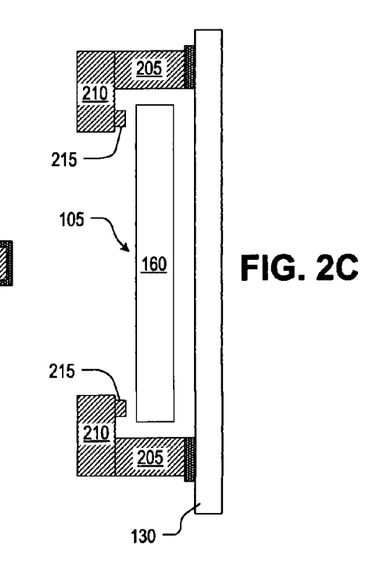
FIG. 2C is a schematic diagram illustrating a cross-sectional view of a MEMS switch illustrating top stoppers and excluding a conductive tether, in accordance with an embodiment of the invention.

FIGS. 2A, 2B, and 2C are schematic diagrams illustrating MEMS switch 100, in accordance with an embodiment of the invention. FIG. 2A is a plan view while FIGS. 2B and 2C are cross-sectional views. FIG. 2B illustrates one of top stoppers 129 and FIG. 2C illustrates both top stoppers 129; however, both FIGS. 2B and 2C exclude conductive tether 126 for clarity. Top stoppers 129 include a base portion 205, a cap portion 210, and a stopper stub 215.

With reference to FIGS. 1A, 1B, 2A, 2B, and 2C the components of MEMS switch 100 and their interrelation are discussed below. Substrate 130 may be formed using any material including various semiconductor substrates (e.g., silicon substrate). Insulator layer 135 is provided as a dielectric layer to insulate bottom electrode 180 and actuation electrode 110 from each other and from bulk layer 137. If bulk layer 137 is an intrinsic insulator then embodiments of the invention may not include insulator layer 135. Although not illustrated, bulk layer 137 may include a number of sub-layers having signal traces or components (e.g., transistors and the like) integrated therein and electrically coupled to any of signal line 125, conductive tether 126, anchors 115, or actuation electrode 110. In an embodiment where bulk layer 137 includes silicon, insulator layer 135 may include a layer of silicon nitride approximately 0.25 μm thick.

In one embodiment, signal line 125 is formed on insulator layer 135 to propagate radio frequency ("RF") signals. However, it should be appreciated that embodiments of MEMS switch 100 may be used to switch other frequency signals including direct current ("DC") signals, low frequency signals, microwave signals, and the like. Bottom electrode 180 and upper layer 185 may be formed using any conductive material, including metal, such as gold (Au). In one embodiment, bottom electrode 180 is approximately 20-60 μm wide and 0.3-0.5 μm thick, while upper layer 185 is approximately 6 μm thick.

Actuation electrode 110 is formed on insulator layer 135 to form a bottom electrode for actuating cantilever electrode 105 and turning on/off MEMS switch 100. Actuation electrode 110 may be formed of any number of conductive materials, including polysilicon. Input port 170 may also be fabricated of polysilicon and is coupled to actuation electrode 110 to switchably apply the actuation voltage thereto. In one embodiment, actuation electrode 110 has a width W1 (e.g., ≈200 μm) and a length L1 (e.g., ≈200 μm) and a thickness of approximately 0.1-0.2 μm. As illustrated, a number of stopper butts 165 are interspersed within actuation electrode 110. In the illustrated embodiment, stopper butts 165 are electrically insulated from actuation electrode 110 by an air gap (e.g., ≈2-3 μm).

As mentioned above, the illustrated embodiment of cantilever electrode 105 includes three members: two narrow members 155 and plate member 160. Narrow members 155 are mounted to anchors 115, which in turn mount cantilever electrode 105 to substrate 130 over actuation electrode 110. In one embodiment, cantilever electrode 105 is fabricated using low stress gradient ("LSG") polysilicon. LSG polysilicon can be processed without severe upward curling of cantilever electrode 105. In other words, during fabrication of cantilever electrode 105 using a LSG polysilicon material, cantilever electrode 105 remains relatively parallel to substrate 130 along its length (e.g., less than 25 nm of bending over 350 μm span of cantilever electrode 105) and therefore distal end 190 experiences relatively minor or no upward curling due to the cantilever electrode 105 itself. However, conductive tether 126 may suffer from upward curling and therefore assert an upward force on cantilever electrode 105 through contact mount 145. Accordingly, in the illustrated embodiment, top stoppers 129 are provided to restrain this upward curling from being excessive.

In one embodiment, plate member 160 has approximately the same dimensions, length L1 and width W1, as actuation electrode 110 (slightly smaller in some embodiments) and narrow members 155 have a width W2 (e.g., ≈30-60 μm) and a length L2 (e.g., ≈50-150 μm). In one embodiment, cantilever electrode 105 is approximately 2-4 μm thick. It should be appreciated that other dimensions may be used for the above components.

Stopper stubs 161 are formed on underside 163 of plate member 160 to prevent cantilever electrode 105 from collapsing directly onto actuation electrode 110 and forming an electrical connection thereto. If cantilever electrode 105 were to form electrical connection with actuation electrode 110 while MEMS switch 100 is closed circuited, then the actuation voltage between the two electrodes would be shorted, and MEMS switch 100 would open. Further, allowing actuation electrode 110 and cantilever electrode 105 to short circuit results in needless and harmful power dissipation. Accordingly, stopper stubs 161 are positioned on underside 163 to align with the insulated stopper butts 165 so as to prevent an electrical connection between cantilever electrode 105 and actuation electrode 110.

In one embodiment, anchor 115 supports cantilever electrode 105 approximately 0.5-2.0 μm above actuation electrode 110. Since polysilicon is a relatively hard substance and due to the multi spring constant nature of cantilever electrode 105 (discussed in detail below) and stopping functionality of stopper stubs 161, very small separation distances between cantilever electrode 105 and actuation electrode 110 can be achieved (e.g., 0.6 μm or less when at rest). Due to the small air gap between cantilever electrode 105 and actuation electrode 110 and the low curling properties of LSG polysilicon, an ultra-low actuation voltage (e.g., 3.0V actuation voltage) MEMS switch 100 can be achieved.

The illustrated embodiment of contact 120 is mounted to cantilever electrode 105 via contact mount 145 and includes a single protruding contact 150 that extends below cantilever electrode 105 to make electrical contact with bottom electrode 180 when MEMS switch 100 is closed circuited. In one embodiment, contact 120 is fabricated of metal, such as gold (Au). In one embodiment, a insulating layer is disposed between contact mount 145 and cantilever electrode 105; however, since contact mount 145 is relatively small and contact 120 and conductive tether 126 are fabricated of metal being substantially more conductive than cantilever electrode 105, the insulating layer may not be included in some embodiments (as illustrated).

As mentioned and illustrated, the embodiment of MEMS switch 100 includes a single protruding contact 150 that extends below cantilever electrode 105 for making an electrical connection with bottom electrode 180. Using a single protruding contact 150 transfers the electrostatic force generated between cantilever electrode 105 and actuation electrode 110 onto a single point contact. Increasing the compressive force/pressure generated at protruding contact 150 decreases the electrical resistance of the contact interface between bottom electrode 180 and contact 120. Since the resistance of this contact interface is in series with signal line 125 and conductive tether 126, reducing this contact interface resistance can improve the operational characteristics of MEMS switch 100 by reducing its RF insertion loss. Furthermore, if debris or contaminates accumulate between bottom electrode 180 and protruding contact 150, a greater compressive force/pressure helps clear or crush the debris to retain good electrical contact when MEMS switch 100 is closed circuited. The illustrated configuration of MEMS switch 100 using conductive tether 126 facilitates this single contact embodiment.

Contact 120 may be mounted to cantilever electrode 105 closer to anchors 115 than to distal end 190. In other words, contact 120 may be positioned between anchors 115 and a center of cantilever electrode 105. Positioning contact 120 closer to anchors 115 helps prevent stiction and false switching due to self-actuation or vibrations, as is discussed below.

Conductive tether 126 includes a tether anchor 127 and a tether beam 128 which straddles a portion of cantilever electrode 105. Tether anchor 127 mechanically mounts one end of conductive tether 126 to substrate 130 and electrically terminates conductive tether 126 to a signal line 181, which may be routed to other electronic components on substrate 130 (not illustrated). The opposite end of tether beam 128 is coupled to contact 120 and contact mount 145. Contact mount 145 supports both tether beam 128 and contact 120.

Conductive tether 126 is suspended above cantilever electrode 105 with a gap 195 (see FIG. 1B). In one embodiment, gap 195 is large enough to sufficiently reduce parasitic capacitances between conductive tether 126 and cantilever electrode 105. In one embodiment, the gap is approximately 0.6-1.0 µm. Similar to signal line 125, tether beam 128 may have dimensions suitable for conducting RF signals (e.g., 6 µm thick, 6-10 µm wide). In one embodiment, conductive tether 126 is fabricated using metal, such as gold (Au).

In the illustrated embodiment, the portion of tether beam 128 straddling cantilever electrode 105 does not take the most direct path between tether anchor 127 and contact mount 145. Rather, tether beam 128 snakes back-and-forth increasing the compliancy of conductive tether 126 to bending. In one embodiment, tether beam 128 has a total indirect path length of approximately 120-150 µm.

Since conductive tether 126 may be fabricated of a relatively thick layer of metal (e.g., 6 µm thick gold suspended conductor), the trace electrical resistance can be neglected. However, conductive tether 126 may suffer from beam curl due to internal stress gradients. The internal stress gradients can be an inherent byproduct resulting from the electroplating process used to build up conductive tether 126 during fabrication. This upwards beam curl may impose on cantilever electrode 105 through contact mount 145, causing cantilever electrode 105 to adversely bend away from actuation electrode 110. If cantilever electrode 105 is pulled upwards away from its nominal or resting position, then the actuation voltage may need to be increased to compensate.

Accordingly, top stoppers 129 are provided to restrain cantilever electrode 105 should conductive tether 127 impose an upward curling force on cantilever electrode 105. Referring to FIGS. 2A, 2B, and 2C, cap portions 210 straddle the edges of cantilever electrode 105 and prevent excessive switch beam bending. In one embodiment, top stoppers 129 are positioned along an axis 220 passing through contact mount 145. By positioning top stoppers 129 along axis 220 passing through the position where conductive tether 128 imposes its upwards curling force (i.e., at contact mount 145), torquing of cantilever electrode 105 is prevented or at least reduced. While top stoppers 129 can be positioned at other locations surrounding cantilever electrode 105, doing so may result in a net non-zero force summation on cantilever electrode 105, resulting in a moment or rotational force.

In one embodiment, cap portions 210 are fabricated on the same process layer and at the same time as tether beam 128. Accordingly, in this embodiment, stopper stubs 215 may be disposed underneath cap portions 210 straddling cantilever electrode 105. Stopper stubs 215 extend down from cap portions 210 to ensure that cantilever electrode 105 does not make physical contact with conductive tether 126 above. In one embodiment, MEMS switch 100 is designed such that cantilever electrode 105 rests, in its nominal position when upwards curl imposed by conductive tether 126 is not present, approximately 0.6-1.0 µm below conductive tether 126. In one embodiment, stopper stubs 215 extend below cap portions 210 approximately 0.3-0.7 µm.

Cantilever electrode 105 may be fabricated by first defining actuation electrode 110 and anchors 115 on substrate 130, then forming a sacrificial layer (e.g., deposited oxide) over actuation electrode 110 to fill the air gap between cantilever electrode 105 and actuation electrode 110. Next, cantilever electrode 105 may be formed over the sacrificial layer and anchors 115 and contact 120 formed thereon. Similarly, another sacrificial layer may be formed over cantilever electrode 105 and conductive tether 126 formed thereon. Subsequently, the sacrificial layers may be etched away with an acid bath (e.g., hydrofluoric acid) to free the bendable cantilever electrode 105 and the compliant conductive tether 126.

It should be appreciated that a number of modifications may be made to the structure of MEMS switch 100 illustrated in FIGS. 1A, 1B, 2A, 2B, and 2C within the spirit of the present invention. For example, a single anchor 115 and single narrow member 155 may be used to suspend a smaller plate member 160 above actuation electrode 110. In this alternative embodiment, protruding contact 150 may protrude on either side of this single narrow member 155 or even protrude through a hole in this single narrow member 155. In yet other embodiments, the specific shapes of cantilever electrode 105 and actuation electrode 110, as well as other components, may be altered.

Figure 3:
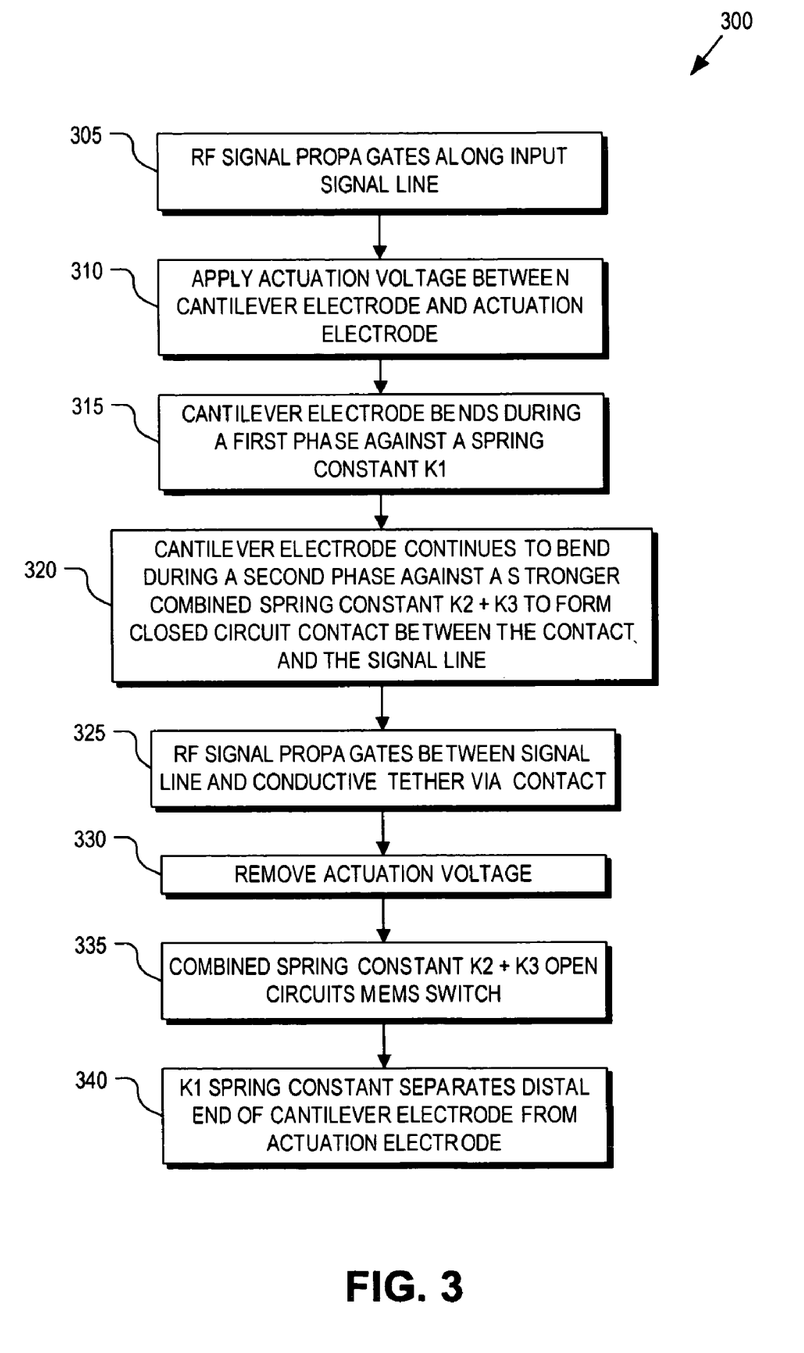
FIG. 3 is a flow chart illustrating a process of operation of a MEMS switch, in accordance with an embodiment of the invention.

FIG. 3 is a flow chart illustrating a process 300 for operation of MEMS switch 100, in accordance with an embodiment of the invention. In should be appreciated that the order in which some or all of the process blocks appear in process 300 should not be deemed limiting. Rather, one of ordinary skill in the art having the benefit of the present disclosure will understand that some of the process blocks may be executed in a variety of orders not illustrated.

In a process block 305, an RF signal is propagated along signal line 125. In a process block 310, an actuation voltage is applied between actuation electrode 110 and cantilever electrode 105. In one embodiment, cantilever electrode 105 is electrically grounded through anchors 115 and the actuation voltage is applied to actuation electrode 110 through input port 170. Alternatively, actuation electrode 110 may be grounded through input port 170 and the actuation voltage applied to cantilever electrode 105 through anchors 115.

Figure 4A:
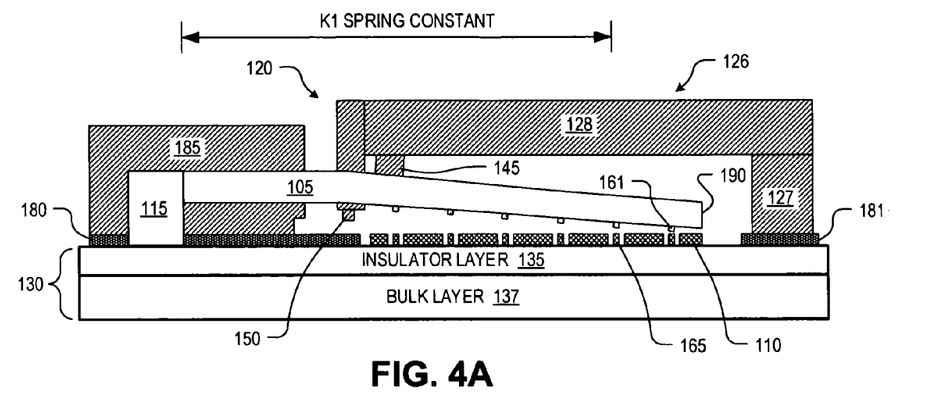
FIG. 4A is a schematic diagram illustrating a first bending phase of a MEMS switch in an open circuit position, in accordance with an embodiment of the invention.

In a process block 315, the application of the actuation voltage across cantilever electrode 105 and actuation electrode 110 induces cantilever electrode 105 to bend or electrostatically collapse toward actuation electrode 110. This initial bending phase is illustrated in FIG. 4A. As illustrated, the actuation voltage is sufficient to cause distal end 190 of cantilever electrode 105 to collapse to a point where the furthest most stopper stub 161 mates with the furthest most stopper butt 165. The actuation voltage is sufficient to overcome the initial restoring force produced by cantilever electrode 105 having a first spring constant K1. The restoring force of cantilever electrode 105 is weakest during this initial bending phase due to the mechanical advantage provided by the lever arm between distal end 190 and anchors 115. It should be noted that during this initial bending phase, protruding contact 150 has not yet formed a closed circuit between signal line 125 and conductive tether 126.

Figure 4B:
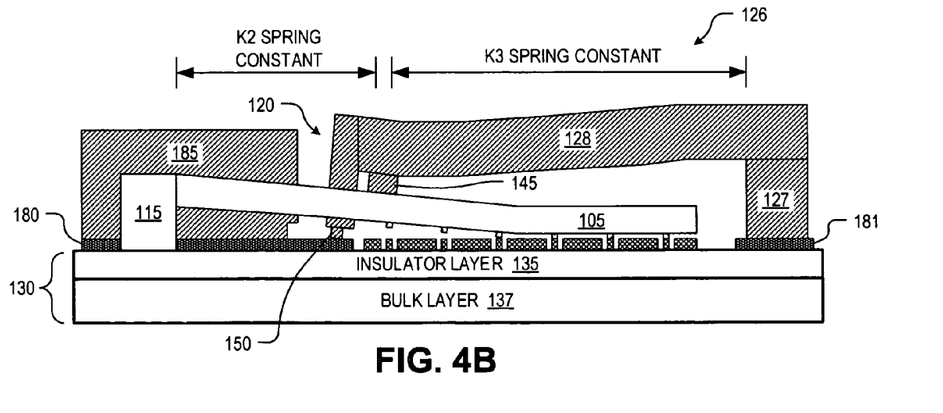
FIG. 4B is a schematic diagram illustrating a second bending phase of a MEMS switch in a closed circuit position, in accordance with an embodiment of the invention.

In a process block 320, MEMS switch 100 enters a second bending phase illustrated in FIG. 4B. Between the point at which distal end 190 makes physical contact with one of stopper butts 165 and MEMS switch 100 becomes closed circuited, the restoring force resisting the electrostatic collapsing force increases proportional to a second larger spring constant K2. Furthermore, conductive tether 126 exerts an additional upwards restoring force with a spring constant K3. However, conductive tether 126 is substantially more compliant than cantilever electrode 105 during the second bending phase (i.e., K2>>K3). Therefore, the electrostatic collapsing force is still sufficient to overcome the combined restoring force exerted on cantilever electrode 105 proportional to the combine spring constant (K2+K3).

It should be understood that cantilever electrode 105 may not have only two abrupt spring constants K1 and (K2+K3), but rather K1 and (K2+K3) represent smallest and largest spring constants, respectively, exerted on cantilever electrode 105 during the course of one switching cycle. During this second bending phase, cantilever electrode 105 begins to collapse inward with a "zipper-like" movement starting at distal end 190 and moving "progressively" or "sequentially" towards anchors 115 until protruding contact 150 contacts bottom electrode 180, forming a closed circuit. As the zipper-like collapsing action continues, the restoring force generated by cantilever electrode 105 increases. However, as cantilever electrode 105 continues to collapse onto stopper butts 165 the separation distance between the cantilever electrode 105 and actuation electrode 110 decreases, resulting in a corresponding increase in the electrostatic collapsing force. This increase in the electrostatic collapsing force is sufficient overcome the increasingly strong restoring force proportional to the larger combined spring constant (K2+K3) exerted on cantilever electrode 105. Accordingly, ultra-low actuation voltages equal to digital logic level voltages (e.g., 3.3V or less) can be reliably achieved with embodiments of the invention.

Once MEMS switch 100 is closed circuited, the RF signal can propagate between signal line 125, conductive tether 126, and signal line 181 via contact 120 (process block 325). To open circuit MEMS switch 100, the actuation voltage is removed (process block 330). Upon removal of the actuation voltage, the electrostatic collapsing force relents, and cantilever electrode 105 restores itself to an open circuit position. Initially, stronger combined spring constant (K2+K3) overcomes contact stiction to restore MEMS switch 100 to the position illustrated in FIG. 4A, at which point MEMS switch 100 is in deed open circuited (process block 335). Subsequently, a weaker restoring force proportional to the spring constant K1 returns MEMS switch 100 to the fully restored position illustrated in FIG. 1B (process block 340).

However, if distal end 190 sticks in the bent position illustrated in FIG. 4A, MEMS switch 100 is still open circuited since contact 120 is not touching bottom electrode 180. Therefore, even if stiction does prevent cantilever electrode 105 from returning to its fully restored or nominal position, MEMS switch 100 will still continue to correctly function as a electromechanical switch. It should be noted that in an embodiment where cantilever electrode 105 is fabricated of polysilicon, the relative hardness of polysilicon over traditional metal cantilevers lends itself to reduced incidence of stiction.

Due to the progressive collapsing or zipper-like action of MEMS switch 100, less wind resistance is generated by cantilever electrode 105 while switching, when compared to the flapping motion generated by traditional electromechanical switches. Accordingly, MEMS switch 100 is well suited for high-speed switch applications, as well as, for low-speed applications. In one embodiment, the greater the actuation voltage the faster the zipper-like switch motion.

Figure 5:
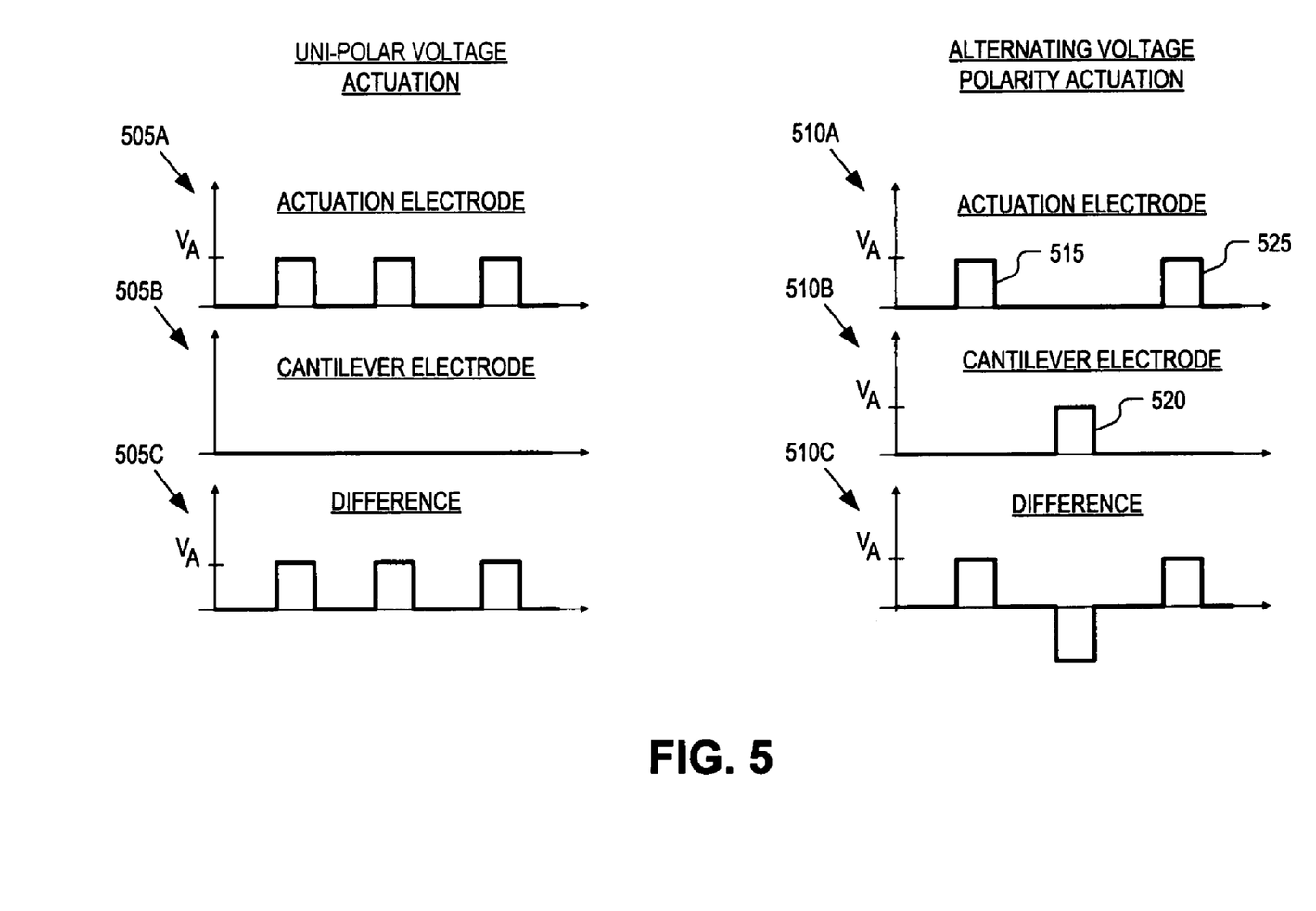
FIG. 5 illustrates line graphs of uni-polar voltage actuation and alternating polarity voltage actuation of a MEMS switch, in accordance with an embodiment of the invention.

Referring to FIG. 5, either uni-polar voltage actuation (illustrated by line graphs 505A, B, C) or alternating voltage polarity actuation (illustrated by line graphs 510A, B, C) may be applied. Since cantilever electrode 105 and actuation electrode 110 are substantially electrically decoupled from the RF signal path (e.g., signal line 125, conductive tether 126, contact 120, and signal line 181), the polarity of the voltage actuation may be changed without affecting the RF signal. Line graph 505A illustrates three consecutive uni-polar actuations of MEMS switch 100 wherein the actuation voltage $V_A$ is applied to actuation electrode 110. Line graph 505B illustrates the same three consecutive actuations wherein the voltage of cantilever electrode 105 remains grounded. Line graph 505C illustrates the voltage different between actuation electrode 110 and cantilever electrode 105.

Line graphs 510A and 510B illustrate three consecutive alternating voltage polarity actuations of MEMS switch 100. A first actuation 515 of MEMS switch 100 is induced by application of actuation voltage $V_A$ to actuation electrode 110 while cantilever electrode 105 remains grounded. A second actuation 520 of MEMS switch 100 is induced by application of actuation voltage $V_A$ to cantilever electrode 105 while actuation electrode 110 remains grounded. A third actuation 525 repeats the first actuation instance 515. Accordingly, line graph 510C illustrates the potential difference between actuation electrode 110 and cantilever electrode 105. Over many cycles, the actuation voltage between the two electrodes will have a net zero DC component. Use of alternating polarity actuations of MEMS switch 100 may be more desirable when higher actuation voltages $V_A$ are used (e.g., >10V).

Figure 6:
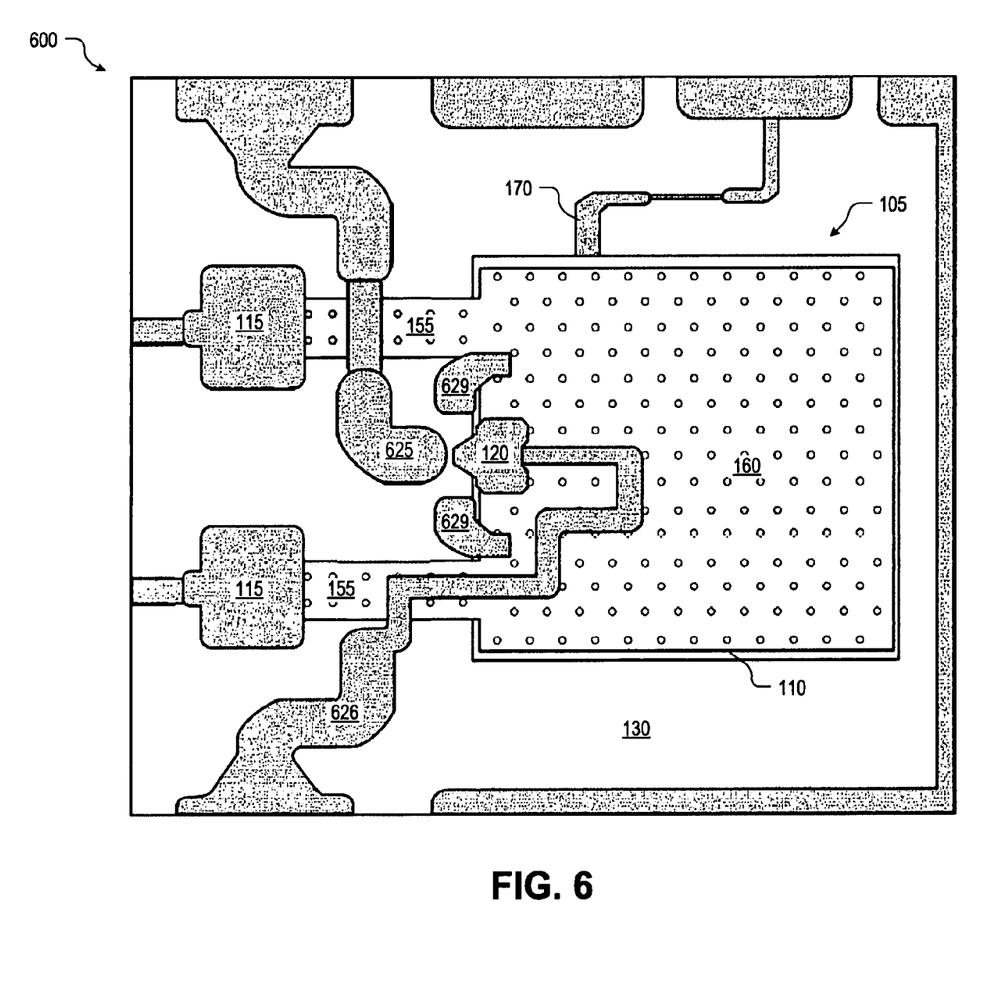
FIG. 6 is a plan view illustrating a circuit layout of a MEMS switch including a conductive tether following an alternative path, in accordance with an embodiment of the invention.

FIG. 6 is a plan view illustrating a circuit layout of a MEMS switch 600 including a conductive tether following an alternative path, in accordance with an embodiment of the invention. MEMS switch 600 is similar to MEMS switch 100 (like parts having like reference labels) with the following three differences. First, a conductive tether 626 straddles a portion of cantilever electrode 105 from a different location and following a different indirect path over cantilever electrode 105. Second, top stoppers 629 are mounted to substrate 130 at different locations and restrain cantilever electrode 105 from upwards curling exerted by conductive tether 626 at different locations. However, it should be noted that top stoppers 629 still retrain cantilever electrode 105 along an axis including contact 120 (though not necessary). Third, signal line 625 is routed along a different path that bridges over one of narrow members 165 of cantilever electrode 105. FIG. 6 illustrates how a number of modifications can be made to MEMS switch 100 in accordance with embodiments of the present invention.

Figure 7:
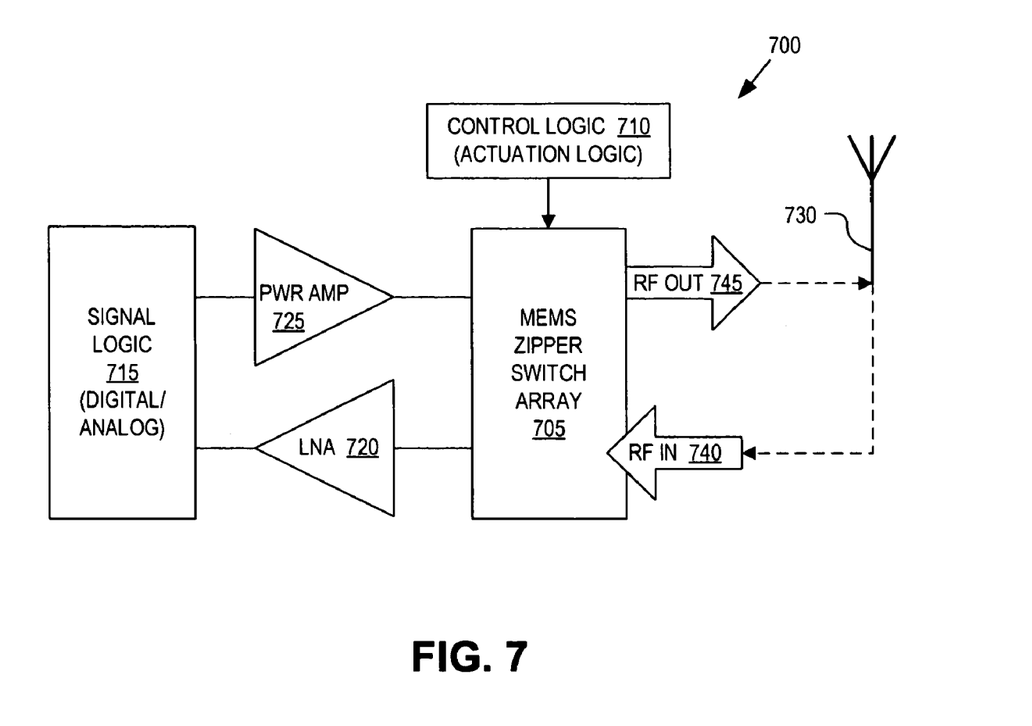
FIG. 7 is a functional block diagram illustrating a demonstrative device implemented with a MEMS switch array, in accordance with an embodiment of the invention.

FIG. 7 is a functional block diagram illustrating a demonstrative device 700 implemented with a MEMS switch array, in accordance with an embodiment of the invention. Device 700 may represent any wireless communication device including a wireless access point, a wireless computing device, a cell phone, a pager, a two-way radio, a radar system, and the like.

The illustrated embodiment of device 700 includes a MEMS switch array 705, control logic 710, signal logic 715, a low noise amplifier ("LNA") 720, a power amplifier 725, and an antenna 730. MEMS switch array 705 may include one or more MEMS switches 100. All or some of the components of device 700 may or may not be integrated into a single semiconductor substrate (e.g., silicon substrate).

Control logic 710 may also be referred to as the actuation logic and is responsible for applying the actuation voltage for switching on/off the MEMS switches within MEMS switch array 705. Control logic 710 couples to actuation electrode 110 and/or cantilever electrode 105 of each MEMS switch within MEMS switch array 705. Since the MEMS switches described herein are capable of ultra-low voltage actuation (e.g., <3.0V), control logic 710 may use logic level voltages (e.g., 3.3 V) to actuate MEMS switch array 705. In one embodiment, the same logic level voltage used by control logic 710 and/or signal logic 715 to switch transistors therein is also used to switch the MEMS switches of MEMS switch array 705.

During a receive operation, control logic 710 applies the actuation voltage to those MEMS switches coupled to RF input 740 such that an RF signal propagates through MEMS switch array 705 to LNA 720 from antenna 730. LNA 720 amplifies the RF signal and provides it to signal logic 715. Signal logic 715 may include analog-to-digital converters to convert the RF signal to a digital signal and further include logic elements to process the digital signal. During a transmit operation, control logic 710 applies the actuation voltage to those MEMS switches coupled to RF output 745 such that an RF signal propagates through MEMS switch array 705 to antenna 730 from power amplifier 725. Signal logic 715 may further include logic to generate a digital signal and a digital-to-analog converter to convert the digital signal to an RF signal. In one embodiment, antenna 730 is an omni-directional antenna.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An apparatus, comprising:
    an actuation electrode mounted to a substrate;
    a cantilever electrode suspended proximate to the actuation electrode;
    a contact mounted to the cantilever electrode;
    a suspended conductor having a first end coupled to the contact and passing over a portion of the cantilever electrode such that a gap exists between the suspended conductor and the cantilever electrode;
    a first signal line permanently coupled to a second end of the suspended conductor; and
    a second signal line positioned to form a closed circuit through the contact and the suspended conductor with the first signal line when an actuation voltage is applied between the actuation electrode and the cantilever electrode.

2. The apparatus of claim 1, further comprising a top stopper mounted to the substrate and reaching over a portion of the cantilever electrode to prevent the cantilever electrode from bending away from the actuation electrode more than a fixed distance.

3. The apparatus of claim 2, wherein the top stopper is positioned to prevent the cantilever electrode from touching the suspended conductor.

4. The apparatus of claim 2, wherein the top stopper includes:
    a cap portion reaching over a portion of the cantilever electrode, the cap portion positioned within a plane including the suspended conductor; and
    a stopper stub protruding from the cap portion towards the cantilever electrode to prevent the cantilever electrode from touching the suspended conductor.

5. The apparatus of claim 2, wherein the top stopper comprises a first top stopper and further comprising a second top stopper, the first and second top stoppers positioned on either side of the contact, both the first and second top stoppers positioned to restrain the cantilever electrode along an axis substantially passing through a contact mount mounting the contact to the cantilever electrode.

6. The apparatus of claim 1, further comprising an anchor mounted to the substrate, the anchor supporting the cantilever electrode at a first end, wherein the cantilever electrode is configured to progressively bend toward the actuation electrode, when the actuation voltage is applied, starting from a distal end of the cantilever electrode and moving toward the first end.

7. The apparatus of claim 6, wherein the cantilever electrode comprises polysilicon.

8. The apparatus of claim 7, wherein the cantilever electrode includes a plurality of stopper stubs protruding from an underside of the cantilever electrode, and wherein the actuation electrode includes a plurality of stopper butts disposed within the actuation electrode but electrically isolated from the actuation electrode, the stopper butts positioned to abut the stopper stubs when the cantilever electrode bends towards the actuation electrode to prevent the cantilever electrode from electrically contacting the actuation electrode when the actuation voltage is applied.

9. The apparatus of claim 6, further comprising another anchor, and wherein the cantilever electrode comprises two narrow members coupled to a plate member at first ends and mounted to the anchors at opposite ends.

10. The apparatus of claim 6, wherein the contact protrudes below the cantilever electrode between the anchor and a middle of the cantilever electrode, and wherein the cantilever electrode includes multiple spring constants, a first of the multiple spring constants to provide a first restoring force to open circuit the second signal line from the contact when the actuation voltage is removed and a second of the multiple spring constants to provide a second restoring force smaller than the first restoring force to separate the distal end of the cantilever electrode from the actuation electrode after the actuation voltage is removed.

11. The apparatus of claim 10, wherein the suspended conductor provides a third restoring force asserted on the cantilever electrode via the contact, the third restoring force being smaller than the first restoring force.

12. The apparatus of claim 1, wherein the suspended conductor follows an indirect path over the cantilever electrode.

13. The apparatus of claim 1, wherein the apparatus comprises a micro-electromechanical system ("MEMS") radio frequency switch.

14. A method of operating an electromechanical switch, comprising:

propagating a signal along a signal line;

applying an actuation voltage, between an actuation electrode and a cantilever electrode suspended proximate to the actuation electrode by an anchor, to progressively bend the cantilever electrode toward the actuation electrode starting from a distal end of the cantilever electrode and moving towards the anchor;

close circuiting the signal line with a conductive tether through a contact mounted to the actuation electrode while the actuation voltage is applied, wherein the conductive tether is suspended above a portion of the cantilever electrode with a gap between the conductive tether and the portion of the cantilever electrode;

propagating the signal between the signal line and the conductive tether through the contact; and restraining the cantilever electrode from bending away from the actuation electrode more than a fixed distance, when the actuation voltage is not applied.

15. The method of claim 14, wherein applying the actuation voltage to progressively bend the cantilever electrode toward the actuation electrode comprises electrostatically collapsing the cantilever electrode toward the actuation electrode with a zipper-like motion starting from the distal end and moving toward the anchor.

16. The method of claim 14, wherein the actuation voltage comprises a digital logic level voltage.

17. The method of claim 14, wherein the actuation voltage is applied between the actuation electrode and the cantilever electrode with alternating polarity between instances of close circuiting the signal line with the conductive tether, through the contact.

18. A system, comprising:

an amplifier;

an antenna; and a micro-electromechanical system ("MEMS") switch coupled in series with the amplifier and the antenna, the MEMs switch including:

an actuation electrode mounted to a substrate;

a cantilever electrode suspended proximate to the actuation electrode;

a contact mounted to the cantilever electrode;

a suspended conductor coupled to the contact and passing over a portion of the cantilever electrode with a gap between the suspended conductor and the cantilever electrode; and a signal line positioned to form a closed circuit with the contact and the suspended conductor when an actuation voltage is applied between the actuation electrode and the cantilever electrode.

19. The system of claim 18, wherein the MEMs switch further includes a top stopper mounted to the substrate and positioned to prevent the cantilever electrode from bending away from the actuation electrode more than a fixed distance.

20. The system of claim 19, wherein the cantilever electrode comprises polysilicon.

21. The system of claim 20, further comprising control logic coupled to generate the actuation voltage, wherein the control logic is configured to generate the actuation voltage having a logic level voltage used by logic elements of the control logic.

* * * * *